(12) United States Patent
Hunziker et al.

(10) Patent No.: US 8,156,815 B2
(45) Date of Patent: Apr. 17, 2012

(54) SENSOR IN A MOULDED PACKAGE AND A METHOD FOR MANUFACTURING THE SAME

(75) Inventors: Werner Hunziker, Stäfa (CH); Felix Mayer, Stäfa (CH)

(73) Assignee: Sensirion AG, Stäfa (CH)

( * ) Notice: Subject to any disclaimer, the term of this patent is extended or adjusted under 35 U.S.C. 154(b) by 138 days.

(21) Appl. No.: 12/660,289

(22) Filed: Feb. 24, 2010

(65) Prior Publication Data
US 2010/0212433 A1  Aug. 26, 2010

(30) Foreign Application Priority Data

Feb. 25, 2009  (EP) .................................... 09002618

(51) Int. Cl.
*G01L 7/00*  (2006.01)
(52) U.S. Cl. .......................................................... 73/706
(58) Field of Classification Search .................. None
See application file for complete search history.

(56) References Cited

U.S. PATENT DOCUMENTS

| | | | |
|---|---|---|---|
| 4,677,850 A | 7/1987 | Miura et al. | |
| 4,829,818 A | 5/1989 | Bohrer | |
| 4,894,707 A | 1/1990 | Yamawaki et al. | |
| 5,333,505 A | 8/1994 | Takahashi et al. | |
| 5,404,753 A | 4/1995 | Hecht et al. | |
| 5,508,611 A | 4/1996 | Schroeder et al. | |
| 6,186,008 B1 * | 2/2001 | Janczek et al. | 73/754 |
| 6,219,253 B1 | 4/2001 | Green | |
| 6,379,988 B1 | 4/2002 | Peterson et al. | |
| 6,555,414 B1 | 4/2003 | Vanfleteren et al. | |
| 6,586,650 B2 | 7/2003 | Baird, Jr. et al. | |
| 6,690,569 B1 | 2/2004 | Mayer et al. | |
| 6,729,181 B2 | 5/2004 | Mayer et al. | |
| 6,750,522 B1 | 6/2004 | Mayer et al. | |
| 6,930,399 B2 | 8/2005 | Paik et al. | |
| 7,109,574 B2 | 9/2006 | Chiu et al. | |
| 7,205,175 B2 | 4/2007 | Raben | |
| 7,238,014 B2 | 7/2007 | Magni et al. | |
| 7,312,106 B2 | 12/2007 | Raben | |
| 7,691,652 B2 | 4/2010 | Van Der Wiel | |
| 7,704,774 B2 | 4/2010 | Mayer et al. | |
| 7,741,950 B2 | 6/2010 | Ehrhorn | |

(Continued)

FOREIGN PATENT DOCUMENTS

EP  0172669  2/1986

(Continued)

OTHER PUBLICATIONS

"Low-cost Plastic Sensor Packaging Using the Open-window Package Concept", C. Cotofana et al., Sensors and Actuators A 67, 1998, pp. 185-190.

*Primary Examiner* — Andre Allen
(74) *Attorney, Agent, or Firm* — Cooper & Dunham LLP

(57) ABSTRACT

The flow sensor or other type of sensor comprises a package having a cylindrical section arranged between an anchor section and a head section. The diameter of the anchor section is typically larger than the diameter of the cylindrical section, which in turn is typically larger than the diameter of the head section. A sensor chip is embedded partially into the package, with a sensitive area being exposed to the surroundings. The sensor can e.g. be inserted into a bore having a diameter matching the one of the cylindrical section.

20 Claims, 6 Drawing Sheets

U.S. PATENT DOCUMENTS

| | | | |
|---|---|---|---|
| 7,793,550 B2 * | 9/2010 | Elian et al. | 73/754 |
| 7,900,521 B2 * | 3/2011 | Hooper et al. | 73/756 |
| 2001/0023087 A1 | 9/2001 | Brandl | |
| 2002/0070464 A1 | 6/2002 | Frezza | |
| 2003/0002994 A1 | 1/2003 | Johnson et al. | |
| 2003/0089160 A1 | 5/2003 | Weyl | |
| 2004/0099057 A1 | 5/2004 | Hornung et al. | |
| 2006/0107750 A1 * | 5/2006 | Tanaka et al. | 73/754 |
| 2007/0113648 A1 | 5/2007 | Arisaka | |
| 2007/0241093 A1 | 10/2007 | von Waldkirch et al. | |
| 2008/0016945 A1 | 1/2008 | Rothacher et al. | |
| 2008/0034877 A1 * | 2/2008 | Fessele et al. | 73/700 |
| 2009/0079423 A1 | 3/2009 | Steinich et al. | |
| 2009/0266173 A1 * | 10/2009 | Kobayashi et al. | 73/724 |
| 2009/0314096 A1 * | 12/2009 | Colombo | 73/754 |
| 2010/0011871 A1 * | 1/2010 | Bigliati et al. | 73/756 |
| 2010/0035373 A1 | 2/2010 | Hunziker et al. | |
| 2010/0043530 A1 * | 2/2010 | Elian et al. | 73/31.06 |
| 2010/0117185 A1 | 5/2010 | Hunziker et al. | |
| 2010/0192696 A1 * | 8/2010 | Schlitzkus et al. | 73/756 |
| 2010/0199777 A1 * | 8/2010 | Hooper et al. | 73/721 |
| 2010/0212433 A1 * | 8/2010 | Hunziker et al. | 73/706 |
| 2011/0036174 A1 * | 2/2011 | Hooper et al. | 73/721 |

FOREIGN PATENT DOCUMENTS

| | | |
|---|---|---|
| EP | 0851225 A2 | 7/1998 |
| EP | 1717562 | 11/2006 |
| EP | 1760437 | 3/2007 |
| GB | 2328284 | 2/1999 |
| IE | 62162 B1 | 12/1994 |
| JP | 2003322632 | 11/2003 |
| WO | WO2006114005 | 11/2006 |
| WO | WO2008046235 | 4/2008 |

* cited by examiner

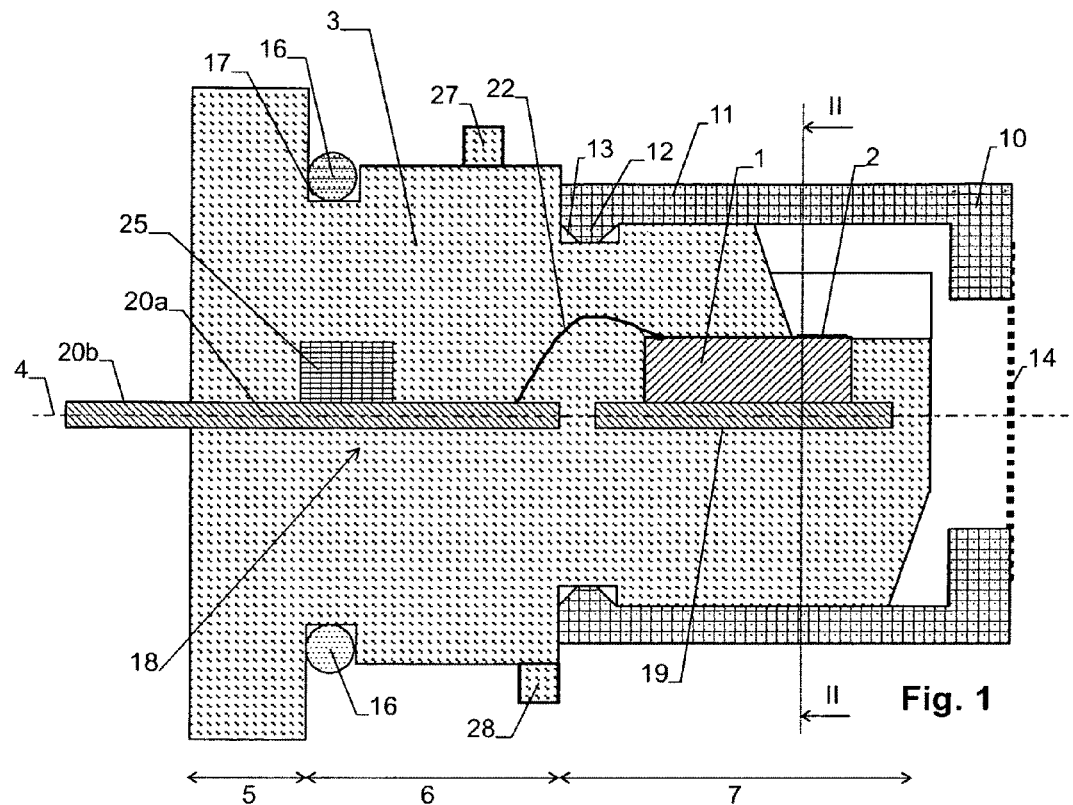
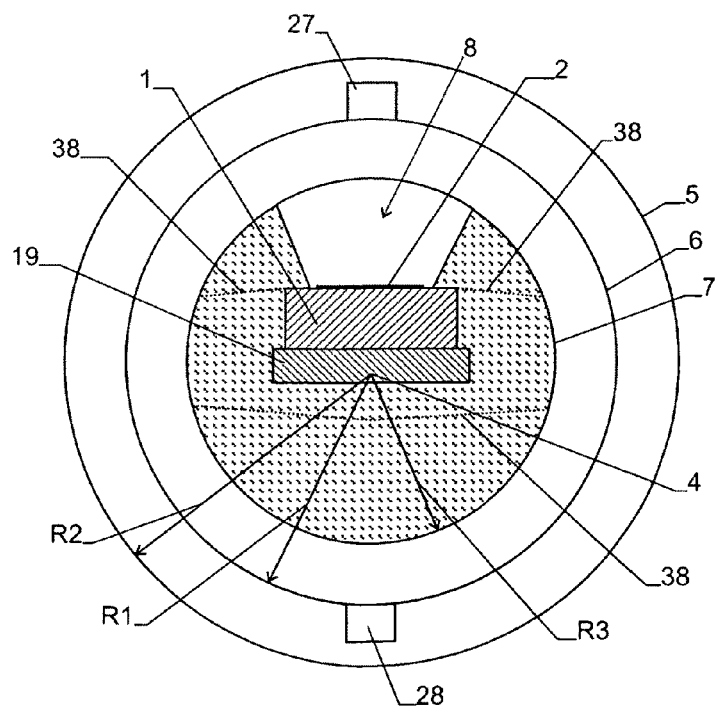

US 8,156,815 B2

SENSOR IN A MOULDED PACKAGE AND A METHOD FOR MANUFACTURING THE SAME

CROSS REFERENCE TO RELATED APPLICATIONS

This application claims the priority of European Patent application EP09002618, filed on Feb. 25, 2009 the disclosure of which is incorporated herein by reference in its entirety.

BACKGROUND OF THE INVENTION

The invention relates to a sensor having a moulded package as well as a method for manufacturing the same. In particular, the invention relates to a pressure, flow or substance sensor of this type.

A sensor of this type is disclosed in US 2007/0113648 A1. It comprises a sensor chip embedded in a cuboid moulded package. A window is provided in the package for exposing a sensitive area of the chip to its surroundings. The sensor is designed to measure a parameter, namely humidity, of said surroundings.

Sensors of this type are typically mounted on printed circuit boards, and the printed circuit boards are then located in contact with the surroundings. Alternatively, the sensors are mounted in suitable holders that allow to bring them into contact with the surroundings, in which case the leads of the sensor are either connected to a circuit board located close by or they are connected to connecting wires leading to a remote circuit board.

It is desired to provide a sensor of this type that can be mounted easily for various types of applications.

SUMMARY OF THE INVENTION

According to an aspect of the present invention, there is provided a sensor according to claim 1. A moulded package of the sensor comprises a cylindrical section. Providing the package with such a cylindrical section makes it, for many applications, much easier to mount the device because it can simply be inserted into a matching cylindrical bore, tube or other type of opening.

In other words, the package combines the purpose of a conventional plastics package (such as acting as a protective coating of the sensor chip) with the purpose of a plug-like mechanical holder suited for insertion into any cylindrical opening with appropriate diameter.

Advantageously, the package further comprises an anchor section which, in at least one direction perpendicular to the axis of the cylindrical section, has a radius exceeding the one of the cylindrical surface. In this case, the anchor section serves as a stop when introducing the package into the opening mentioned above. Advantageously, in all directions perpendicular to said axis, the anchor section has a radius exceeding the radius of the cylindrical section, which allows the anchor section to act as a kind of cap closing the end of the receiving opening.

The sensor is advantageously manufactured by mounting the sensor chip to a lead frame section and placing the lead frame section with the chip into a mould. A hardening package material is then inserted into the mould and hardened. The mould has a cylindrical interior chamber section for forming the cylindrical section of the package.

BRIEF DESCRIPTION OF THE DRAWINGS

Embodiments of the present invention will be better understood from the following detailed description. Such description makes reference to the annexed drawings, which show:

FIG. 1 a sectional view of a first embodiment of the sensor cut along its axis,

FIG. 2 a sectional view along line II-II of FIG. 1, without the protective cap,

DETAILED DESCRIPTION OF THE INVENTION

Definitions

Figure 3:
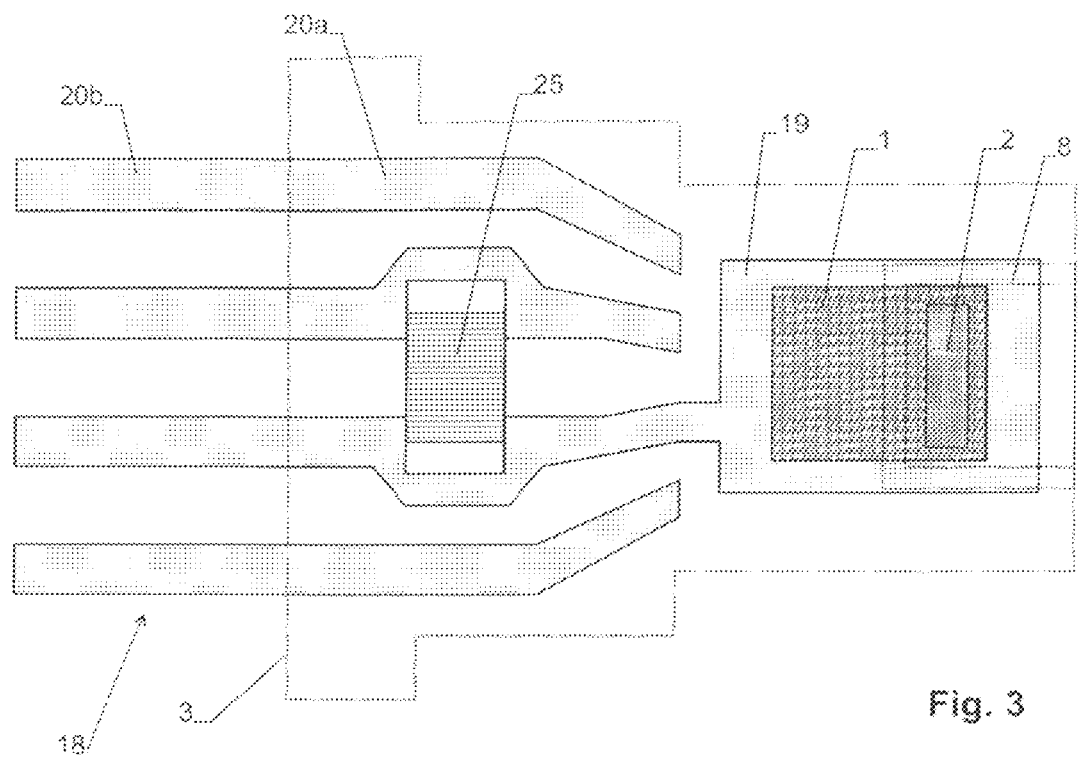
FIG. 3 a top view of the sensor of FIG. 1 with the package shown transparent and in dashed lines, FIG. 4 a sectional view of a second embodiment of the sensor cut along its axis, FIG. 5 sectional view of a third embodiment of the sensor cut along its axis, FIG. 6 a top view of the sensor of FIG. 5, with the components embedded within the package shown in dashed lines, FIG. 7 a top view of a fourth embodiment of the sensor, with the components embedded within the package shown in dashed lines, FIG. 8 sectional view of a fifth embodiment of the sensor cut along its axis, FIG. 9 sectional view of a sixth embodiment of the sensor cut along its axis, FIG. 10 a first application of the sensor of FIG. 1, FIG. 11 a second application of the sensor of FIG. 1, FIG. 12 a view of a seventh embodiment of the sensor with cap, and FIG. 13 the sensor of FIG. 12 without the cap.

The term "radius" as used herein designates the extension of the package from an axis designated by the reference numeral 4 in the drawings to its surface, in a direction perpendicular to axis 4.

The terms "radial" and "axial" refer to the directions perpendicular and parallel, respectively, to the axis 4 of the sensor.

The "sensor chip" is any integrated sensor on a substrate, such as a silicon substrate or a glass substrate. It has a sensitive area for measuring a parameter of its surroundings. It may e.g. be a substance sensor, i.e. a sensor for measuring the presence and/or amount of a given substance in the surrounding fluid, for example a carbon dioxide sensor or a humidity sensor as described in WO 01/42776. Or it may e.g. be a pressure sensor, such as described in EP 1 860 417 or a flow sensor, such as described in EP 1 840 535.

First Embodiment

The sensor of FIGS. 1-3 comprises a sensor chip 1 having a sensitive area 2. It is moulded partially into a package 3, which is typically of a plastics material as known to the skilled person.

Package 3 has an axis 4 and, along axis 4, package 3 comprises an anchor section 5, a cylindrical section 6 and a head section 7, with cylindrical section 6 being arranged between anchor section 5 and head section 7.

As can best be seen in FIG. 2, cylindrical section 6 has a cylindrical outer surface arranged coaxially to axis 4. In the shown embodiment, anchor section 5 and head section 7 also have substantially cylindrical outer surfaces coaxial to axis 4.

The shapes of the outer surfaces of anchor section 5 and head section 7 may, however, also be non-cylindrical, e.g. rectangular or polygonal.

However, at least in one direction perpendicular to axis 4, anchor section 5 advantageously has a radius R2 exceeding the radius R1 of cylindrical section 6. Thus, it can act as an axial stop when inserting package 3 into an opening as described above.

Similarly, the radius R3 of head section 7 advantageously does not exceed the radius R1 of cylindrical section 6, and, in at least one direction, it advantageously has a smaller radius R3 than the radius R1 of cylindrical section 6. Thus, the package can be inserted with head section 7 first into the opening as described above.

In the embodiment of FIG. 1, sensor chip 1 is located at least partially in head section 7, and sensitive area 2 is not covered by package 3 but rather located in a window formed by a recess 8, which is open in radial direction. It is also open axially towards the end of package 3 that faces away from anchor section 5, such that sensitive area 2 is well exposed to the surroundings.

A protective cap 10 (only shown in FIG. 1) can be arranged over head section 7 for protecting the sensor and in particular sensitive area 2. Cap 10 is advantageously provided with axially extending legs 11 having toe portions 12 snapped into a groove or recess 13 extending around head section 7.

As shown in FIG. 1, cap 10 can carry a filter 14, e.g. formed by a mesh, a porous material or a semi-permeable membrane in order to prevent unwanted substances or particles from reaching sensitive area 2.

As it is also shown in FIG. 1, the sensor advantageously comprises a sealing ring 16 located in a circumferential recess 17 and extending around cylindrical section 6. The purpose of sealing ring 16 is to seal the opening into which the sensor has been inserted. In the embodiment as shown, sealing ring 16 abuts radially e.g. against the inner wall of a surrounding opening or bore. Alternatively, sealing ring 16 can be arranged to abut axially against e.g. a flat surface surrounding such opening or bore.

As can best be seen from FIGS. 1 and 3, the sensor further comprises a lead frame section 18, typically of a metal. Lead frame section 18 comprises an "embedded section", embedded in package 3, comprising a die pad 19 and embedded parts 20a of the leads. Lead frame section 18 further comprises a "contact section" formed by non-embedded parts 20b of the leads and not being covered by package 3. Contact section 20b is exposed for connecting the sensor to other circuitry. Bond wires 22 connect the embedded parts 19 of the leads to sensor chip 1. Sensor chip 1 is typically fastened, e.g. glued, to die pad 19.

In the embodiment of FIGS. 1-3 as well as in some of the following embodiments, at least part of lead frame section 18 extends parallel to axis 4. In the shown embodiment, axis 4 even extends through lead frame section 18.

The arrangement of lead frame section 18 parallel to axis 4 has the advantage that the extension of the sensor along axis 4 can be arbitrarily large, which allows the sensor to reach deep into the opening that it is mounted in.

As it can also be seen in FIG. 1, sensitive area 2 is located on a surface of sensor chip 1 that extends parallel to axis 4. Again, this allows sensitive area 2 to be located deeply within the opening that receives the sensor.

In any embodiment of the present invention, lead frame section 18 advantageously is located at least partially in anchor section 5 and its contact section 20b extends from anchor section 5, thus allowing to connect the sensor from the side of the anchor section.

As can be seen in FIGS. 1 and 3, the sensor shown here comprises, in addition to sensor chip 1, a further circuit element 25 embedded in package 3. Circuit element 25 is e.g. a blocking capacitor and is connected to the ground and supply voltage leads of lead frame section 18. It may e.g. be glued or soldered onto lead frame section 18. Circuit element 25 can also e.g. consist of or comprise an integrated processing circuit and/or other active or passive circuitry.

Figure 6:
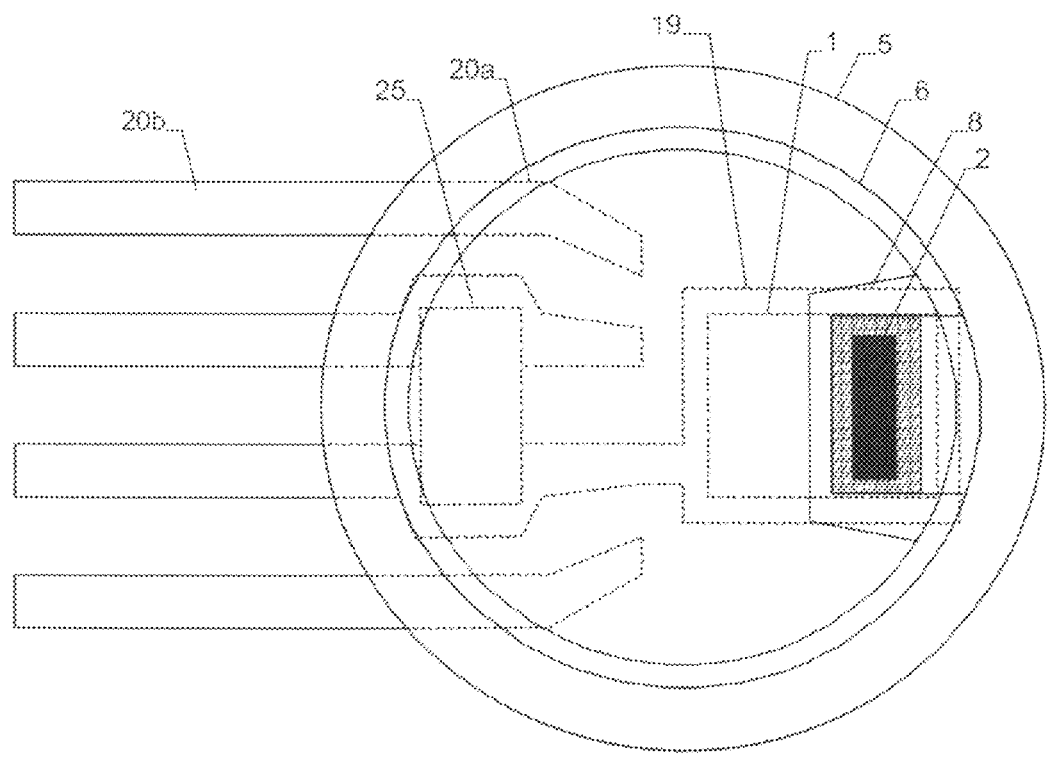

FIGS. 1 and 2 show that the outer surface of cylindrical section 6 may be equipped with structures allowing to fasten the sensor in its opening. In the embodiment of FIG. 6 this is achieved by protrusions 27 extending away from the cylindrical outer surface of cylindrical section 6 for forming a bayonet-type coupling.

Similarly, such protrusions 28 may also form a tangential stop preventing a rotation of the sensor in its opening.

In general, at least one structure on the outer surface of the sensor can be provided for attaching the sensor, e.g. in an opening, and/or for locking the sensor against rotation about axis 4.

Second Embodiment

Figure 4:
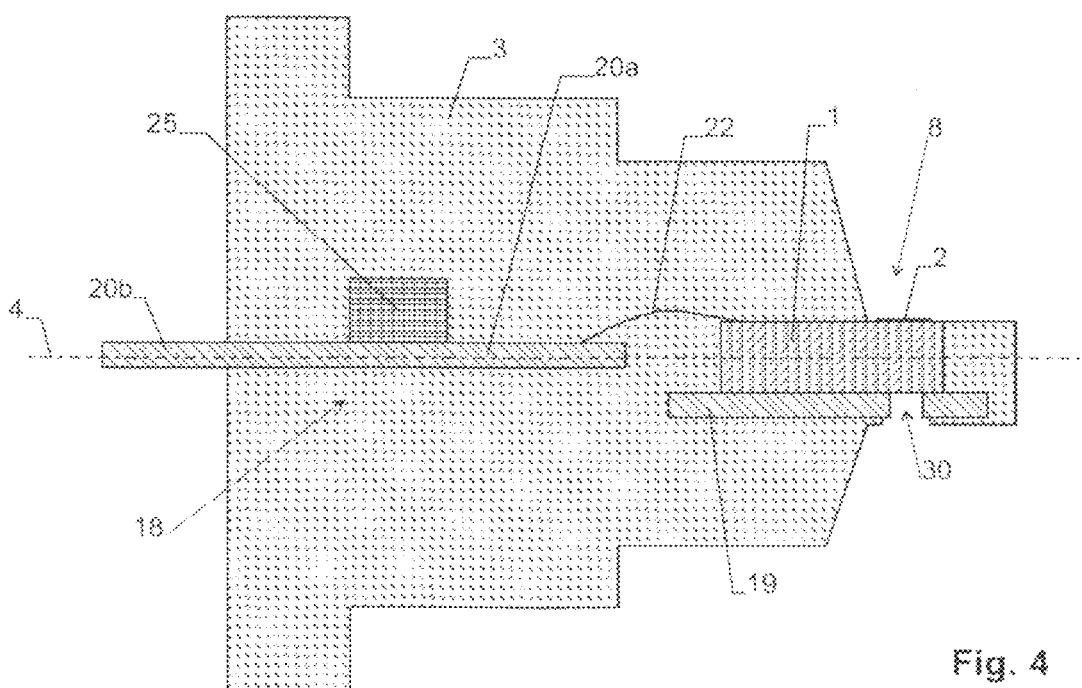

The second embodiment of the device as shown in FIG. 4 differs from the first one in that a lead frame section 18 with a "recessed" die pad 19 has been used, i.e. die pad 19 resides in a plane parallel to but offset from the plane of the leads 20a, 20b. This has the advantage that the leads 20a, 20b can be laterally offset in respect to the bottom surface of sensor chip 1. In the embodiment of FIG. 4 this is used for placing the leads 201, 20b as well as the center plane of sensor chip 1 into axis 4.

As it is also illustrated in FIG. 4, a recess 30 can be formed in package 3 at a location below sensor chip 1. This may be useful whenever an access to the bottom side of sensor chip 1 is required, e.g. if sensor chip 1 has been mounted to the lead frame section using "flip chip" technology.

Third Embodiment

Figure 5:
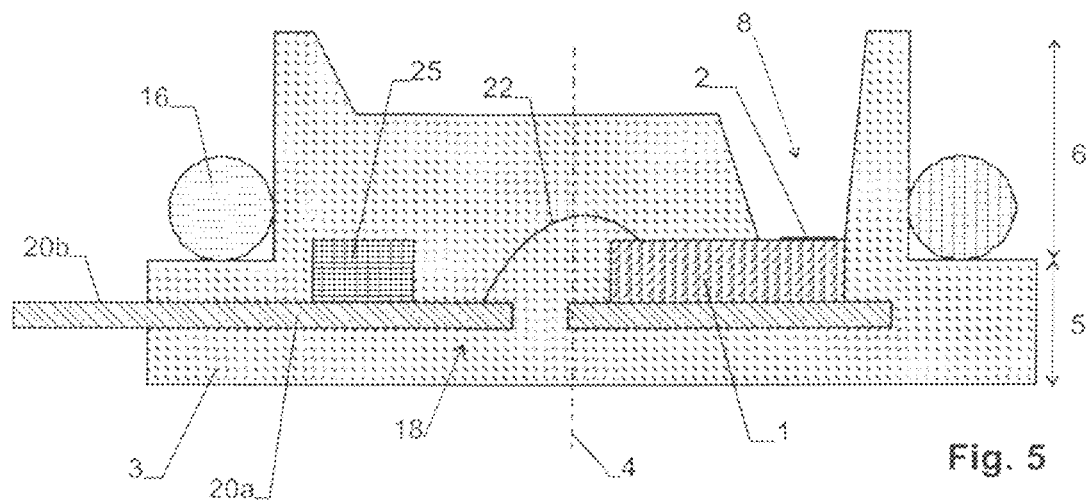

In the embodiments shown so far, lead frame section 18 extends parallel to axis 4. The embodiment in FIGS. 5 and 6 represents a type of sensor where at least part of lead frame section 18 extends perpendicularly to axis 4. This design has the advantage that it allows to build flatter sensors as well as sensors with radially protruding leads.

The sensor of FIGS. 5 and 6 again has a package 3 with anchor section 5 and cylindrical section 6, wherein anchor section 5 has, at least in one direction, a radius larger than the radius of cylindrical section 6. The outer surface of cylindrical section 6 is again coaxial to the axis 4 of the sensor.

In the third embodiment, lead frame section 18 is located completely in anchor section 5, with sensor chip 1 being arranged on that side of die pad 19 which faces cylindrical section 6. Sensitive area 2 is again located in a window formed by a recess 8, with recess 8 opening towards the axial end face of the sensor.

Again, a sealing ring 16 extends around cylindrical section 6 for sealingly embedding the sensor in the opening. Sealing ring 16 arranged to abut in axial direction (i.e. in a direction parallel to axis 4) against a surface.

Fourth Embodiment

Figure 7:
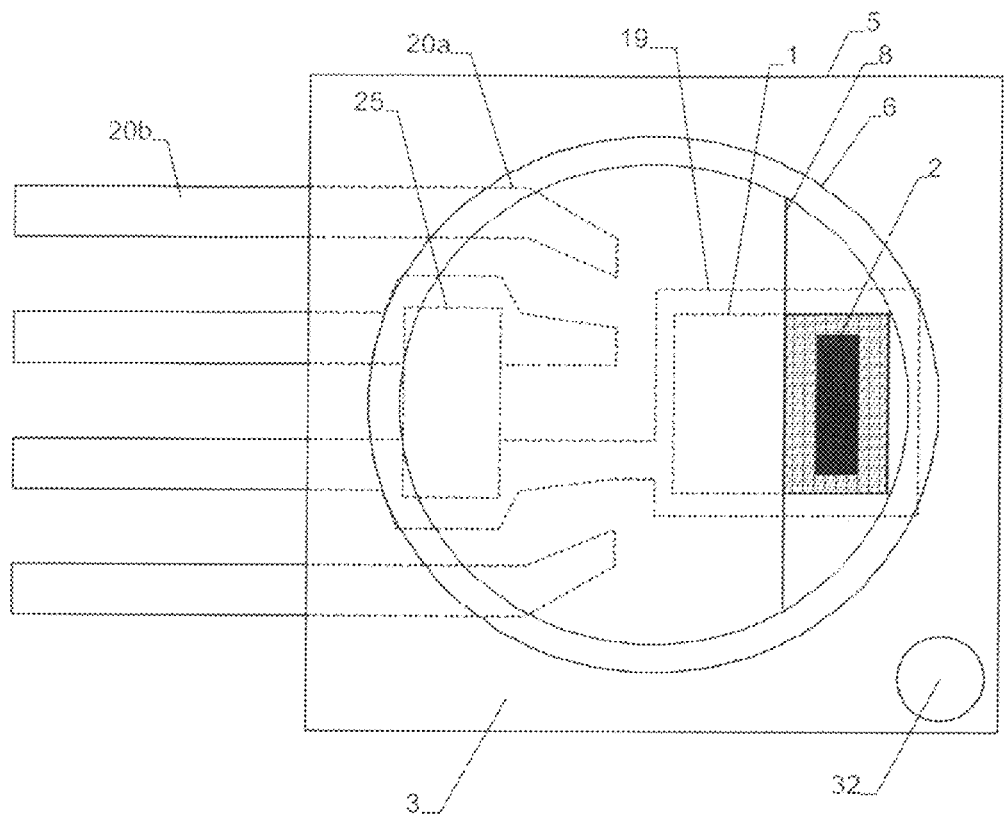

In the embodiments shown so far, anchor section 5 has cylindrical circumference. FIG. 7 shows an embodiment of the invention where anchor section 5 has rectangular circumference. Also, as illustrated, anchor section 5 can be equipped with structures allowing to fasten it to a support, such as a hole 32 for receiving a screw.

FIG. 7 further shows a differently formed recess or window 8 especially suited for flow measurement.

Fifth Embodiment

In the embodiment of FIGS. 5 and 6, recess 8 has to be sufficiently deep to reach all the way to sensitive area 2, which makes it necessary to either make cylindrical section 6 comparatively short or to make recess 8 comparatively deep.

Figure 8:
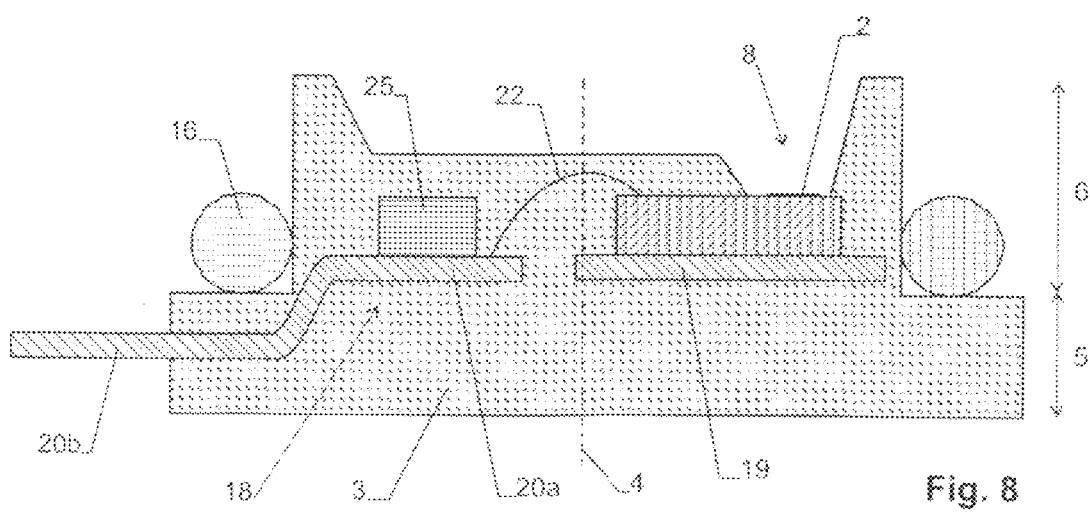

This potential design drawback is overcome by the fifth embodiment of the device as shown in FIG. 8, where lead frame section 18 has a non-planar configuration, e.g. by having suitably bent leads 20a, such that it reaches into cylindrical section 6, thus allowing to mount sensor chip 1 closer to the end of the sensor and therefore to make recess 8 more shallow for the same cylindrical section length.

Sixth Embodiment

The leads of lead frame section 18, and in particular the exposed parts 20b thereof, may also be bent at an angle of approximately 90° such that their ends extend parallel to axis 4, while the embedded section 20a of the leads as well as die pad 19 extend perpendicular to axis 4. This allows to create a sensor that requires less space in radial direction.

Figure 9:
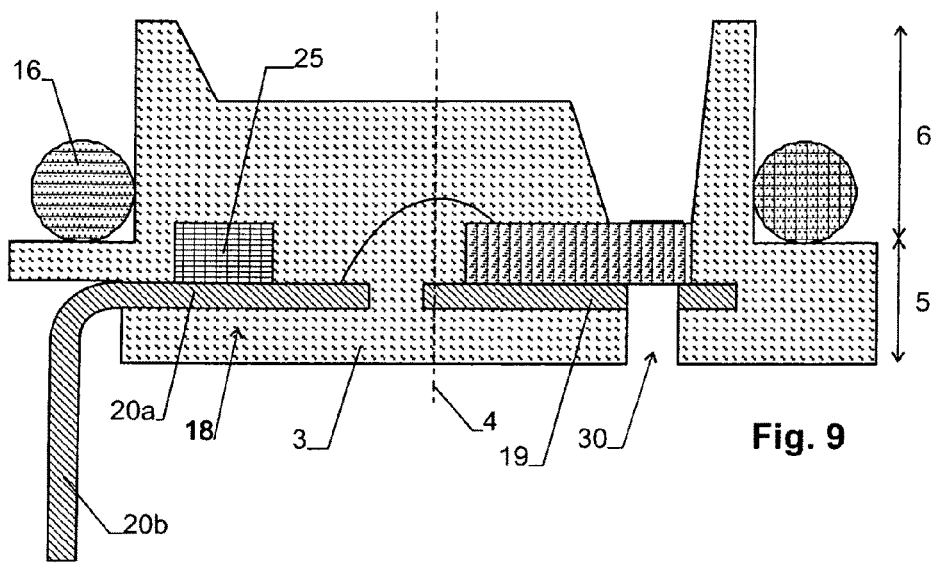

Such an embodiment is shown in FIG. 9.

FIG. 9 also shows that a recess 30 can be formed in package 3 at a location below sensor chip 1 and extending through anchor section 5. This is e.g. useful for a differential pressure sensor measuring the pressure difference above and below semiconductor chip 2.

Seventh Embodiment

Figure 12:
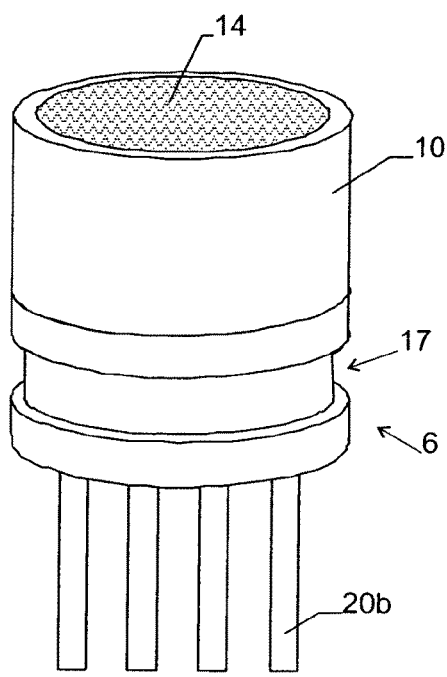
Figure 13:
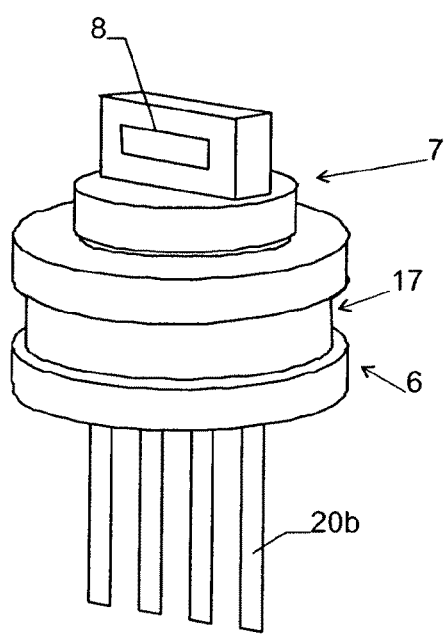

FIGS. 12 and 13 show a seventh embodiment of a sensor of the present invention.

This embodiment of the sensor substantially corresponds to the one of FIGS. 1 and 2, but does not comprise an anchor section, thus that it can be inserted deeply into any suitable opening.

FIGS. 12 and 13 also show the circumferential groove or recess 17 for receiving the sealing ring 16.

Manufacturing the Sensor

The sensor described here can be manufactured in a substantially conventional transfer mould process, as it is e.g. used for semiconductor packaging.

Typically, a plurality of sensor chips 1 is first mounted to a lead frame comprising a plurality of lead frame sections 18, e.g. by being glued to die pads 19 of the individual lead frame sections 18. Then, they are connected to the leads 20a, 20b by means of the bond wires 22. Also, the circuit elements 25 can be mounted to the leads 20a, 20b, e.g. by conducting glue.

In a next step, the assembly of lead frame sections with the sensor chips is placed in a suitable mould. The mould is shaped to form the packages 3. A hardening package material is injected into the mould and hardened. Then the mould can be removed. The individual sensors can finally be formed by separating the lead frame sections, e.g. in a punching process.

The mould advantageously has a first mould part and a second mould part with a separating plane between the first and the second mould part extending parallel to the lead frame section.

Recess 8 can be formed e.g. using the techniques described in WO 2006/114005.

For the embodiments of FIGS. 4 and 8, a preformed lead frame section can be used. For manufacturing the embodiment of FIG. 9, the leads 20b can be bent after forming the packages.

Application

Figure 10:
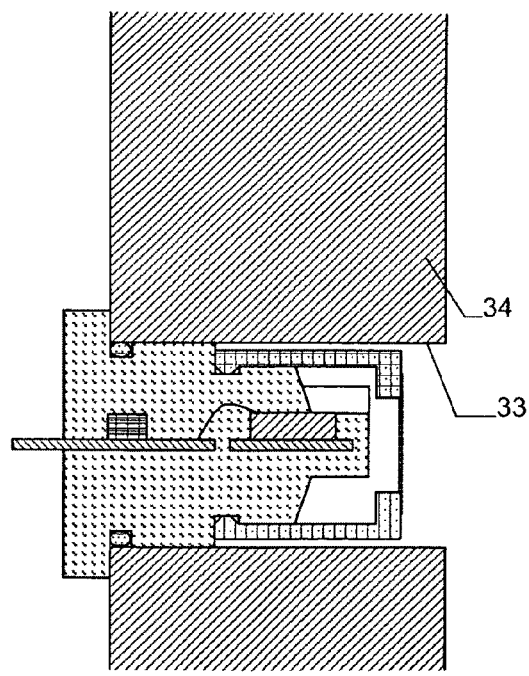

As mentioned, the sensor can e.g. be inserted into a cylindrical opening, such as a tube or a bore. This is illustrated in FIG. 10, where the sensor is located in a bore 33 extending through a wall 34, e.g. the wall of a gas channel.

Figure 11:
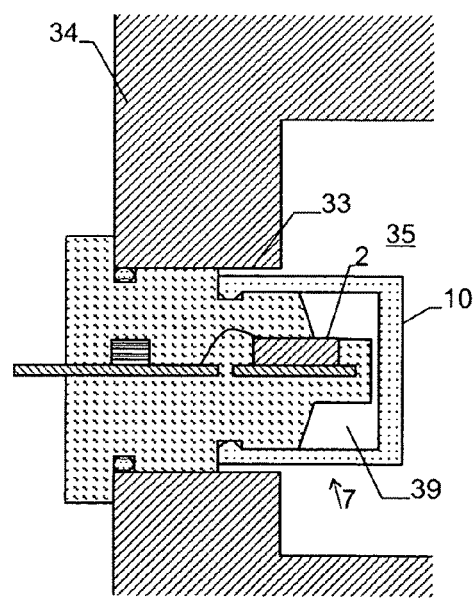

If the sensor is to be used as a flow sensor, an arrangement as shown in FIG. 11 can be used. Here, opening 33 extends through a wall 34 into a flow channel 35, where a fluid is flowing into a direction perpendicular to the plane of the drawing. Head section 7 of the sensor extends into flow channel 35. Cap 10 is provided with at least two, e.g. opposing, openings 39, perpendicular to the plane of drawing, such that the fluid in flow channel 35 can flow through it and along sensitive area 2 in well-defined manner.

When the sensor is being used as a flow sensor, recess 8 is advantageously formed such that the sensitive area 2 is well exposed to the flowing fluid. This is illustrated in FIG. 2, where the dotted lines 38 indicate a possible cross section of head section 7 in such an application. This cross section is elongated with substantially flat sides, wherein sensitive area 2 is arranged at one of the flat sides.

The invention claimed is:

1. A sensor comprising a sensor chip having a sensitive area for measuring a parameter of its surroundings, a moulded package, wherein said sensor chip is moulded partially into said package with at least part of said sensitive area not being covered by said package for exposure to its surroundings, a cylindrical section of said package, said cylindrical section having a cylindrical surface coaxially to an axis.

2. The sensor of claim 1 wherein said package further comprises an anchor section which, in all directions perpendicular to said axis, has a radius exceeding a radius of said cylindrical section.

3. The sensor of claim 1 further comprising a sealing ring extending around said cylindrical section.

4. The sensor of claim 1 further comprising a lead frame section, wherein said lead frame section comprises an embedded section embedded at least partially in said package and being electrically connected to said sensor chip, a contact section not covered by said package.

5. The sensor of claim 4 wherein at least part of said lead frame section extends parallel to said axis.

6. The sensor of claim 5 wherein said axis extends through said lead frame section.

7. The sensor of claim 4 wherein at least part of said lead frame section extends at least partially perpendicularly to said axis.

8. The sensor of claim 7 wherein said lead frame section is bent to reach into said cylindrical section.

9. The sensor of claim 1, wherein a lead frame section of the sensor comprises an embedded section embedded least partially in said package and being electrically connected to said sensor chip, and a contact section not covered by said package, wherein said package further comprises an anchor section which, in at least one direction perpendicular to said axis, has a radius exceeding a radius of said cylindrical surface, and wherein said contact section extends from said anchor section.

10. The sensor of claim 4 further comprising a circuit element in addition to said sensor chip embedded in said package, wherein said circuit element is connected to power supply lines of said lead frame section.

11. The sensor of claim 10, wherein said circuit element comprises a capacitor.

12. The sensor of claim 1 wherein said sensitive area is located on a surface of said sensor chip extending parallel to said axis.

13. The sensor of claim 1 wherein said sensitive area is located on a surface of said sensor chip extending perpendicularly to said axis.

14. The sensor of claim 1 wherein said package further comprises a head section, wherein, in all directions perpendicular to said axis, said head section has a radius not exceeding a radius of said cylindrical section and wherein, in at least one direction perpendicular to said axis, said head section has an radius smaller than the radius of said cylindrical section.

15. The sensor of claim 14 further comprising a protective-cap mounted over said head section.

16. The sensor of claim 14 wherein said cap further comprises a filter for preventing unwanted substances or particles from reaching said sensitive area.

17. The sensor of claim 14 wherein said cap further comprises at least two openings for allowing passage of a fluid a flow of which is to be measured.

18. The sensor of claim 1 wherein said sensor is a pressure sensor, a substance sensor and/or a flow sensor.

19. The sensor of claim 1 further comprising at least one structure on a surface of said package for attaching the sensor and/or locking the sensor against rotation about axis 4.

20. A method for manufacturing the sensor of claim 1 comprising the steps of providing said sensor chip, mounting said sensor chip to a lead frame section, placing said lead frame section with said sensor chip in a mould and injecting a hardening package material into said mould.

* * * * *